(12) United States Patent
Kim et al.

(10) Patent No.: US 11,479,664 B2
(45) Date of Patent: Oct. 25, 2022

(54) ENCAPSULATING COMPOSITION

(71) Applicant: LG CHEM, LTD., Seoul (KR)

(72) Inventors: So Young Kim, Daejeon (KR); Seung Min Lee, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 115 days.

(21) Appl. No.: 16/954,943

(22) PCT Filed: Dec. 18, 2018

(86) PCT No.: PCT/KR2018/016101
§ 371 (c)(1),
(2) Date: Jun. 17, 2020

(87) PCT Pub. No.: WO2019/124924
PCT Pub. Date: Jun. 27, 2019

(65) Prior Publication Data
US 2020/0377710 A1    Dec. 3, 2020

(30) Foreign Application Priority Data
Dec. 18, 2017    (KR) .......................... 10-2017-0174041

(51) Int. Cl.
*C08L 23/22*    (2006.01)
*H01L 51/52*    (2006.01)
(Continued)

(52) U.S. Cl.
CPC .............. *C08L 23/22* (2013.01); *C08K 3/013* (2018.01); *C08L 23/26* (2013.01); *C08L 2203/206* (2013.01)

(58) Field of Classification Search
CPC ....................................................... C08L 23/22
See application file for complete search history.

(56) References Cited

U.S. PATENT DOCUMENTS 9,708,518 B2    7/2017   Zhang et al.
9,806,287 B2 *  10/2017  Yoo .......................... H01L 51/56
(Continued)

FOREIGN PATENT DOCUMENTS

CN    106415341 A  *  2/2017   .............. C09J 11/02
JP    2018-513888 A     5/2018
(Continued)

OTHER PUBLICATIONS

Machine translation, Fujinaga, Chinese Pat. Pub. No. CN-106415341-A, translation date: Apr. 15, 2022, Espacenet, all pages. (Year: 2022).*

(Continued)

*Primary Examiner* — Victoria K. Hall
(74) *Attorney, Agent, or Firm* — Dentons US LLP

(57) ABSTRACT

The present application relates to a composition for encapsulating an organic electronic element and an organic electronic device comprising the same, and provides the composition which forms an encapsulating structure capable of effectively blocking water or oxygen introduced from the outside into the organic electronic device, thereby securing the lifetime of the organic electronic device and implementing endurance reliability of the encapsulating structure at high temperature and high humidity, and has high shape retention characteristics, and an organic electronic device comprising the same.

19 Claims, 1 Drawing Sheet

(51) Int. Cl.
H01L 51/56 (2006.01)
C08L 23/26 (2006.01)
C08K 3/013 (2018.01)

(56) References Cited

U.S. PATENT DOCUMENTS

| | | | | |
|---|---|---|---|---|
| 10,202,525 | B2 * | 2/2019 | Park | C09D 151/04 |
| 10,647,890 | B2 | 5/2020 | Bae et al. | |
| 10,800,953 | B2 | 10/2020 | Kim et al. | |
| 11,111,377 | B2 * | 9/2021 | Ryoo | C08L 51/003 |
| 11,283,048 | B2 * | 3/2022 | Lee | H01L 51/5246 |
| 11,319,468 | B2 * | 5/2022 | Lee | C08L 75/04 |
| 2006/0078781 | A1 * | 4/2006 | Stegink | H01M 8/028 |
| | | | | 429/510 |
| 2016/0005999 | A1 * | 1/2016 | Lee | H01L 51/5256 |
| | | | | 428/351 |
| 2018/0051193 | A1 | 2/2018 | Shim et al. | |
| 2018/0072925 | A1 | 3/2018 | Kim et al. | |
| 2018/0118984 | A1 * | 5/2018 | Lee | C08L 33/04 |
| 2018/0171188 | A1 | 6/2018 | Bae et al. | |
| 2020/0270438 | A1 | 8/2020 | Lee et al. | |

FOREIGN PATENT DOCUMENTS

| | | | | | |
|---|---|---|---|---|---|
| JP | 2018-513889 | A | | 5/2018 | |
| JP | 2018-513890 | A | | 5/2018 | |
| JP | 2018-524432 | A | | 8/2018 | |
| JP | 2019-073691 | A | * | 5/2019 | C08L 23/22 |
| JP | 2019-073691 | A | | 5/2019 | |
| JP | 2020-533463 | A | | 11/2020 | |
| KR | 10-2014-0147736 | A | | 12/2014 | |
| KR | 10-2016-0114540 | A | | 10/2016 | |
| KR | 10-2016-0114541 | A | | 10/2016 | |
| KR | 10-2016-0114542 | A | | 10/2016 | |
| KR | 10-2016-0144933 | A | | 12/2016 | |
| KR | 10-2016-0147285 | A | * | 12/2016 | C08G 59/20 |
| KR | 10-2016-0147285 | A | | 12/2016 | |
| TW | 201307506 | A1 | | 2/2013 | |
| WO | 2016/200179 | A1 | | 12/2016 | |
| WO | 2017/111057 | A1 | | 6/2017 | |
| WO | WO-2017111057 | A1 | * | 6/2017 | H01L 23/12 |
| WO | 2017/203622 | A1 | | 11/2017 | |
| WO | WO-2017203622 | A1 | * | 11/2017 | H01L 21/3213 |

OTHER PUBLICATIONS

Machine translation, Nita, WIPO Pat. Pub. No. WO 2017111057-A1, translation date: Apr. 11, 2022, Espacenet, all pages. (Year: 2022).*

Machine translation, Tabata, Japanese Pat. Pub. No. JP-2019-073691-A, translation date: Apr. 11, 2022, Espacenet, all pages. (Year: 2022).*

Machine translation, Watase, WIPO Pat. Pub. No. WO-2017203622-A1, translation date: Apr. 11, 2022, Espacenet, all pages. (Year: 2022).*

Machine translation, Watanabe, Korean Pat. Pub. No. KR-2016-0147285-A, translation date: Apr. 11, 2022, Espacenet, all pages. (Year: 2022).*

The International Bureau of WIPO, International Preliminary Reporton Patentability, International Application No. PCT/KR2018/016101, dated Jun. 23, 2020, all pages. (Year: 2020).*

Ieternational Searching Authority, Written Opinion of the International Searching Authority, International Application No. PCT/KR2018/016101, dated Mar. 21, 2019, all pages. (Year: 2019).*

C. Rocco et al., Highly-interpenetrated and phase-separated UV-cured interpenetrating methacrylate-epoxide polymer networks: Influence of composition on properties and microstructure, Dec. 2, 2015, Materials Today Comms., vol. 6, pp. 17-27. (Year: 2015).*

Physical Property Modifications in UV-Curable Pressure Sensitive Adhesives, Jan. 25, 2003, www.adhesivesmag.com, all pages. (Year: 2003).*

Office Action of Taiwanese Patent Office in Appl'n No. 107145674, dated Apr. 28, 2022.

* cited by examiner

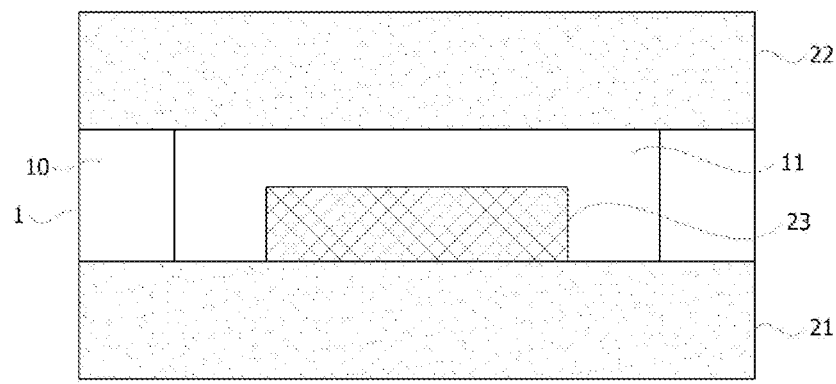

ENCAPSULATING COMPOSITION

CROSS-REFERENCE TO RELATED APPLICATIONS

This application is a National Phase entry pursuant to 35 U.S.C. § 371 of International Application No. PCT/KR2018/016101 filed on Dec. 18, 2018, and claims the benefit of priority based on Korean Patent Application No. 10-2017-0174041 filed on Dec. 18, 2017, the disclosure of which is incorporated herein by reference in its entirety.

TECHNICAL FIELD

Technical Field

The present application relates to a composition for encapsulating an organic electronic element, an organic electronic device comprising the same, and a method for manufacturing the organic electronic device.

Background Art

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and extended application of the OLED, durability is the most important problem. Organic materials and metal electrodes, and the like contained in the OLED are very easily oxidized by external factors such as moisture. Thus, products containing OLEDs are highly sensitive to environmental factors. Accordingly, various methods have been proposed in order to effectively block infiltration of oxygen or moisture from the outside to the organic electronic device such as the OLED.

DISCLOSURE

Technical Problem

The present application provides an encapsulating composition which can form an encapsulating structure capable of effectively blocking water or oxygen introduced from the outside into the organic electronic device, thereby securing the lifetime of the organic electronic device and realizing endurance reliability of the encapsulating structure at high temperature and high humidity, and has high shape retention characteristics, and an organic electronic device comprising the same.

Technical Solution

The present application relates to an encapsulating composition. The encapsulating composition may be an encapsulating material applied to sealing or encapsulating an organic electronic device such as, for example, an OLED. In one example, the encapsulating composition of the present application may be applied to sealing or encapsulating at least one side of an organic electronic element to form an encapsulating structure. Thus, after the encapsulating composition is applied to the encapsulation, it may be present at the periphery of the organic electronic device.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present invention, the organic electronic device may be an OLED.

An exemplary composition for encapsulating an organic electronic element may comprise an olefin-based resin, a curable oligomer and a curable monomer. The curable oligomer may be included in an amount of 20 to 90 parts by weight, 22 to 70 parts by weight, 25 to 50 parts by weight, 26 to 45 parts by weight, 29 to 40 parts by weight or 30 to 38.5 parts by weight, relative to 100 parts by weight of the olefin-based resin. Here, the curable oligomer may be a compound having a glass transition temperature of 55° C. or lower, 50° C. or lower, 30° C. or lower, 0° C. or lower, −10° C., −18° C. or lower, −25° C. or lower, −30° C. or lower, or −40° C. or lower after curing, where the lower limit is not particularly limited, but may be −100° C. or higher. In one example, the compositions of the present application may not comprise a curable oligomer having a glass transition temperature of greater than 55° C., greater than 30° C., greater than 0° C., or greater than −10° C. In the encapsulating composition formulation of the olefin-based resin, the curable oligomer and the curable monomer, the present application can realize the shape retention characteristics and the moisture- and heat-resistant durability under severe conditions while realizing moisture barrier performance by controlling the content and glass transition temperature ranges of the curable oligomer.

In one example, the present application comprises a moisture adsorbent, which is described below, in the encapsulating composition, where the moisture adsorbent means a material capable of removing moisture or oxygen through a chemical reaction with the moisture or oxygen penetrated into the encapsulating structure. Generally, when a moisture adsorbent reacts with moisture in an encapsulating structure, the volume expands as it reacts with moisture, resulting in stress. Besides, the encapsulating structure of the present application comprises a large amount of the moisture adsorbent in the periphery of the substrate on which the organic electronic element is formed, as described below, and thus when it does not have sufficient elasticity to relieve the expansion stress due to moisture adsorption, the encapsulating structure may peel off from the adherend or the encapsulating structure may be destroyed. Accordingly, in a specific formulation of the encapsulating composition, the present application realizes the shape retention characteristics of the encapsulating structure and the durability at high temperature and high humidity under severe conditions while realizing moisture blocking performance.

In this specification, the glass transition temperature may be a physical property after curing. Unless otherwise specified herein, the glass transition temperature may mean a glass transition temperature after curing it at any temperature between 50 and 300° C. for 20 minutes to 200 minutes; a glass transition temperature after irradiating it with ultraviolet rays at an irradiance level of 1 $J/cm^2$ to 10 $J/cm^2$; or a glass transition temperature after the ultraviolet ray irradiation, followed by the thermal curing.

In an embodiment of the present application, the olefin-based resin in the encapsulating composition may be an olefin-based resin containing one or more reactive functional groups. In one example, the olefin-based resin may be a hydrophobic resin, and may have a water vapor transmission rate of 50 g/m²·day or less. Considering that the encapsulating composition of the present application is applied to seal or encapsulate an organic electronic device, it can provide an excellent moisture barrier property by comprising the olefin-based resin satisfying the above water vapor transmission rate range. In this specification, the "resin having a water vapor transmission rate of 50 g/m²·day or less" may mean a resin that in a state where the resin is prepared in the form of a film formed of a resin layer having any one of 5 to 100 μm, the water vapor transmission rate measured in the thickness direction of the film is 50 g/m²·day or less. The water vapor transmission rate is measured under 100° F. and 100% relative humidity, which may be 50 g/m²·day or less, 40 g/m²·day or less, 30 g/m²·day or less, 20 g/m²·day or less, or 10 g/m²·day or less. The lower the water vapor transmission rate is, the better the moisture barrier property can be exhibited, and thus the lower limit is not particularly limited, but may be, for example, 0 g/m²·day or 0.1 g/m²·day.

Specifically, an exemplary olefin-based resin of the present application comprises an olefin-based resin derived from a mixture of monomers, where the mixture may have at least an isoolefin monomer component having 4 to 7 carbon atoms or a multi-olefin monomer component. The isoolefin may be present, for example, in a range of 70 to 100 wt %, or 85 to 99.5 wt %, based on the total monomer weight. The multi-olefin-derived component may be present in a range of 0.5 to 30 wt %, 0.5 to 15 wt %, or 0.5 to 8 wt %.

The isoolefin may be exemplified by, for example, isobutylene, 2-methyl-1-butene, 3-methyl-1-butene, 2-methyl-2-butene, 1-butene, 2-butene, methyl vinyl ether, indene, vinyltrimethylsilane, hexene, or 4-methyl-1-pentene. The multi-olefin may have 4 to 14 carbon atoms and may be exemplified by, for example, isoprene, butadiene, 2,3-dimethyl-1,3-butadiene, myrcene, 6,6-dimethyl-fulvene, hexadiene, cyclopentadiene, or piperylene. Other polymerizable monomers, such as styrene and dichlorostyrene, can also be homopolymerized or copolymerized.

In the present application, the olefin-based resin may comprise an isobutylene-based homopolymer or copolymer. As mentioned above, the isobutylene-based olefin-based resin or polymer may mean an olefin-based resin or polymer comprising 70 mol % or more of repeating units from isobutylene and one or more other polymerizable units.

In the present application, the olefin-based resin may be a butyl rubber or a branched butyl rubber. An exemplary olefin-based resin is an unsaturated butyl rubber, such as a copolymer of olefin or isoolefin and multi-olefin. As the olefin-based resin comprised in the encapsulating composition of the present invention, poly(isobutylene-co-isoprene), polyisoprene, polybutadiene, polyisobutylene, poly(styrene-co-butadiene), natural rubber, butyl rubber, and a mixture thereof can be exemplified. The olefin-based resin useful in the present application may be prepared by any suitable means known in the art, and the present invention is not limited by this method of preparing an olefin-based resin.

In one example, the olefin-based resin may be a low molecular weight polyisobutylene resin. For example, the olefin-based resin may have a weight average molecular weight of 100,000 g/mol or less, less than 100,000 g/mol, 90,000 g/mol or less, or 70,000 g/mol or less, and the lower limit may be 500 g/mol or more, or 55,000 g/mol or more. By controlling the weight average molecular weight of the olefin-based resin in the above range, the present application can realize an encapsulating composition suitable for application and encapsulation processes. The encapsulating composition may have a liquid phase shape and may be suitably applied to side encapsulation application of an organic electronic device to be described below.

The reactive functional group contained in the olefin-based resin may be a polar functional group. In addition, the reactive functional group may have reactivity with the above-mentioned curable oligomer and/or curable monomer. The kind of the reactive functional group is not particularly limited, but may be, for example, an acid anhydride group, a carboxyl group, an epoxy group, an amino group, a hydroxyl group, an isocyanate group, an oxazoline group, an oxetane group, a cyanate group, a phenol group, a hydrazide group or an amide group. An example of the olefin-based resin having the reactive functional group may include succinic anhydride modified polyisobutylene, maleic anhydride modified liquid phase polyisobutylene, maleic anhydride modified liquid phase polyisoprene, epoxy modified polyisoprene, hydroxyl group modified liquid phase polyisoprene or allyl modified liquid phase polyisoprene. As such an olefin-based resin forms a crosslinked structure with the above-mentioned curable oligomer and/or curable monomer, the present application can realize an encapsulating composition having physical properties such as a moisture barrier property and a handling property desired in the present application.

In one example, the encapsulating composition of the present application may comprise a curable oligomer. The oligomer may have one or more curable functional groups or multi-functionality with two or more curable functional groups. The present application makes it possible to maintain the elasticity of the encapsulating structure while complementing the low heat durability at high temperature and high humidity of the conventional olefin-based resin by comprising the curable oligomer.

The curable oligomer may have a weight average molecular weight in a range of 400 to 50,000 g/mol, 430 to 30,000 g/mol, 450 to 10,000 g/mol, 500 to 8000 g/mol, 800 to 6000 g/mol, 1000 to 5000 g/mol or 1500 to 4000 g/mol. The present application can realize the desired physical properties as the side encapsulating material by comprising the oligomer having the weight average molecular weight range. In this specification, the weight average molecular weight means a value converted to standard polystyrene measured by GPC (gel permeation chromatograph).

In one example, the curable oligomer may comprise at least one or more or two or more curable functional groups. The curable functional group may comprise one or more thermosetting functional groups such as an epoxy group, a glycidyl group, an isocyanate group, a hydroxyl group, a carboxyl group or an amide group, or may comprise a curable functional group by electromagnetic wave irradiation such as a urethane group, an epoxide group, a cyclic ether group, a sulfide group, an acetal group or a lactone group. In an embodiment of the present application, the curable oligomer may comprise urethane acrylate, silicone acrylate, aliphatic acrylate or polyester acrylate, but is not limited thereto. In one example, in consideration of the aforementioned glass transition temperature range, the curable oligomer may not comprise epoxy acrylate, but is not limited thereto.

In an embodiment of the present application, the encapsulating composition may further comprise a curable monomer, as described above. The curable monomer may have a weight average molecular weight of less than 400 g/mol, 50 to 380 g/mol or 100 to 300 g/mol. In applying an encapsulating material on a substrate, on which an organic electronic element is formed, the present application realizes excellent application properties and processability by comprising the curable monomer. In addition, as the curable monomer is included, the present application can prevent the damage applied to the element by providing the encapsulating composition in a solventless type.

In one example, the curable monomer may have a viscosity in a range of 500 cP or less, or 50 cP to 300 cP, as measured at a temperature of 25° C., a strain of 5% and a frequency of 1 Hz. In applying the encapsulating composition to the periphery of the organic electronic element, the present application can secure processability by comprising the curable monomer having the viscosity range.

The material of the curable monomer is not particularly limited and may include, for example, an epoxy compound, an oxetane compound or an acrylic monomer. The acrylic monomer may include a monofunctional acrylic compound or a multifunctional acrylic compound.

In one example, as the curable monomer, an aromatic or aliphatic; or linear or branched epoxy compound may be used. In one embodiment of the present invention, an epoxy compound having an epoxy equivalent of 50 g/eq to 350 g/eq or 100 g/eq to 300 g/eq, which comprises two or more functional groups, may be used. In the present application, as the curable monomer, an epoxy resin having a cyclic structure in its molecular structure can be used, and for example, an alicyclic epoxy resin can be used. The alicyclic epoxy resin can be cured without phase separation by having excellent compatibility with an olefin-based resin or a curable monomer to achieve uniform crosslinking of the composition.

Also, the linear or branched aliphatic epoxy compound may include aliphatic glycidyl ether, 1,4-butanediol diglycidyl ether, ethylene glycol diglycidyl ether, 1,6-hexanediol diglycidyl ether, propyleneglycol diglycidyl ether, diethylene glycol diglycidyl ether, butyl glycidyl ether, 2-ethylhexyl glycidyl ether or neopentyl glycol diglycidyl ether, but is not limited thereto.

Furthermore, as long as the oxetane group compound as the curable monomer has an oxetane functional group, the structure thereof is not limited, which may be exemplified by, for example, OXT-221, CHOX, OX-SC, OXT101, OXT121, OXT221 or OXT212 from TOAGOSEI, or EHO, OXBP, OXTP or OXMA from ETERNACOLL.

In addition, as the curable monomer, the acrylic monomer may include polybutadiene dimethacrylate, 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentyl glycol di(meth)acrylate, dicyclopentanyl di(meth)acrylate, dicyclopentanyl di(meth)acrylate, cyclohexane-1,4-dimethanol di(meth)acrylate, tricyclodecane dimethanol (meth)acrylate, dimethylol dicyclopentane di(meth)acrylate, neopentyl glycol modified trimethylpropane di(meth)acrylate, adamantane di(meth)acrylate, trimethylol propane tri(meth)acrylate, or a mixture thereof.

In an embodiment of the present application, the curable monomer may be included in an amount of 10 to 45 parts by weight, 12 to 43 parts by weight, 13 to 38 parts by weight or 14 to 25 parts by weight, relative to 100 parts by weight of the olefin-based resin. Within the above content range, the present application can improve the application properties of the encapsulating composition and realize heat resistance holding power.

In one example, the encapsulating composition may further comprise an inorganic filler. The inorganic filler may be included separately from a moisture adsorbent, which is described below, for controlling the thixotropic property of the encapsulating composition. The specific kind of the filler that can be used in the present application is not particularly limited, and for example, one of silica, calcium carbonate, alumina, talc and the like, or a mixture of two or more thereof may be used.

In the present application, in order to improve the bonding efficiency between the filler and the organic binder, a product surface-treated with an organic material may be used as the filler, or a coupling agent may be further added thereto and used.

The encapsulating composition of the present application may include 0.1 parts by weight to 30 parts by weight, 1 part by weight to 28 parts by weight, or 3 parts by weight to 23 parts by weight of an inorganic filler, relative to 100 parts by weight of the olefin-based resin. By controlling the content of the inorganic filler in the above range, the present application can provide an encapsulating material in which the intended encapsulating structure shape in the present application can be easily realized.

Furthermore, the BET surface area of the inorganic filler may be in a range of 35 to 500 $m^2/g$, 40 to 400 $m^2/g$, 50 to 300 $m^2/g$, or 60 to 200 $m^2/g$. The specific surface area has been measured using the BET method, and specifically, it may be measured by adding, as a sample, 1g of the inorganic filler to a tube with ASAP2020 (Micromeritics, USA) without pretreatment at −195° C. The average value can be obtained by measuring the same sample three times. By controlling the specific surface area of the inorganic filler in the above range, the present application can provide an encapsulating material in which the intended encapsulating structure shape in the present application can be easily realized.

In addition, in an embodiment of the present application, the encapsulating composition may comprise a curing agent, if necessary. The curing agent may be a thermal curing agent or a photo-curing agent. For example, a suitable type of curing agent may be selected and used depending on the types of functional groups contained in the olefin-based resin, the curable oligomer or the curable monomer, and one or more curing agents may be used.

In one example, in the case of comprising an epoxy group, the curing agent is an epoxy curing agent known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

In an embodiment of the present application, the curing agent may be a latent thermal curing agent such as an imidazole-isocyanuric acid adduct, an amine-epoxy adduct, a boron trifluoride-amine complex or encapsulated imidazole. That is, in the present invention, light irradiation may proceed first in the curing step of the encapsulating composition to control the initial fluidity, and the curing agent may be completely cured as a latent curing agent in a final curing step after light irradiation.

The content of the curing agent may be selected depending on the composition of the composition, for example, the kind or ratio of the resin. For example, the curing agent may be included in an amount of 1 part by weight to 100 parts by weight, 1 part by weight to 90 parts by weight or 1 part by weight to 80 parts by weight, relative to 100 parts by weight of the olefin-based resin. The weight ratio may be adjusted depending on the kind and ratio of the functional group of the olefin-based resin, the acrylic oligomer or the curable monomer, or the crosslinking density to be implemented.

In an embodiment of the present application, the encapsulating composition may comprise an initiator. As the initiator, for example, a cationic initiator or a photo-radical initiator may be included.

The cationic initiator may be a cationic photopolymerization initiator, and for example, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

The radical initiator may be a photo-radical initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The content of the photo-radical initiator can be changed depending on the kind and ratio of the functional group in the radical photocurable compound, the crosslinking density to be implemented, and the like. For example, the photo-radical initiator may be compounded in a ratio of 0.1 to 15 parts by weight, 3 parts by weight to 12 parts by weight or 6 parts by weight to 10 parts by weight, relative to 100 parts by weight of the olefin-based resin. By comprising the photo-radical initiator in the above content range, the present invention can introduce an appropriate crosslinked structure into the encapsulating composition to realize flow control at high temperature.

In one example, the initiator may comprise a cationic initiator and a radical initiator together, where the cationic initiator may be included in an amount of 0.01 to 10 parts by weight, 0.05 to 5 parts by weight, 0.1 to 4 parts by weight, 0.3 to 2 parts by weight or 0.5 to 1.5 parts by weight, relative to 100 parts by weight of the olefin-based resin and the radical initiator may be included in an amount of 3 to 12 parts by weight, 4 to 11 parts by weight, 5 to 10 parts by weight, 6 to 9 parts by weight or 7 to 8 parts by weight, relative to 100 parts by weight of the olefin-based resin. In one example, the radical initiator content of the present application may be greater than the cationic initiator content. By controlling the above content range, the present application can realize a proper crosslinked structure in the encapsulating composition to improve heat resistant durability at high temperature and high humidity.

The encapsulating composition of the present application may further comprise a moisture adsorbent. The term "moisture adsorbent" can be used to collectively mean a component capable of adsorbing or removing moisture or moisture introduced from the outside through physical or chemical reaction or the like. That is, it means a moisture-reactive adsorbent or a physical adsorbent, and a mixture thereof is also usable.

The moisture-reactive adsorbent chemically reacts with humidity, moisture or oxygen, and the like introduced into the resin composition or the cured product thereof to adsorb moisture or humidity. The physical adsorbent can lengthen the moving path of moisture or humidity penetrating into the resin composition or the cured product thereof to inhibit the penetration and can maximize the barrier property against moisture or humidity through the matrix structure of the resin composition or the cured product thereof and interaction with the moisture-reactive adsorbent or the like.

In the present application, the specific kind of the usable moisture adsorbent is not particularly limited, and for example, in the case of the moisture-reactive adsorbent, it may include one or a mixture of two or more of a metal oxide, a metal salt or phosphorus pentoxide ($P_2O_5$), and the like; and in the case of the physical adsorbent, it may include zeolite, zirconia or montmorillonite, and the like.

Here, a specific example of the metal oxide may include lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto.

In the present application, the moisture adsorbent such as the metal oxide can be compounded in the composition in a properly processed state. For example, a pulverization process of the moisture adsorbent may be required, and a process such as a three-roll mill, a bead mill or a ball mill may be used for pulverizing the moisture adsorbent.

The encapsulating composition of the present application may comprise the moisture adsorbent in an amount of 10 to 150 parts by weight, 35 parts by weight to 120 parts by weight, 40 to 100 parts by weight, 45 parts by weight to 90 parts by weight, 50 to 85 parts by weight, 55 to 80 parts by weight, 60 to 79 parts by weight, or 63 to 77 parts by weight, relative to 100 parts by weight of the olefin-based resin. As the encapsulating composition of the present application preferably controls the content of the moisture adsorbent to 10 parts by weight or more, the encapsulating composition or the cured product thereof can exhibit excellent moisture and humidity barrier properties. In addition, when the content of the moisture adsorbent is controlled to 150 parts by weight or less to form a thin film encapsulating structure, it can exhibit excellent moisture barrier properties.

In one example, the moisture adsorbent may have an average particle diameter in a range of 0.1 to 10 μm, 1 to 8 μm, 1.5 to 5 μm or 1.5 to 3.5 μm. In the present application, the particle diameter may be measured according to D50 particle size analysis, unless otherwise specified. The present application can comprise an excessive amount of the moisture adsorbent in the encapsulating structure while increasing the reactivity with moisture by controlling the particle diameter to improve the moisture barrier performance.

In one example, the encapsulating composition may be in a liquid phase at room temperature, for example, at about 25° C. In an embodiment of the present application, the encapsulating composition may be in a solventless type liquid phase. The encapsulating composition may be applied to encapsulating an organic electronic element, and specifically, may be applied to encapsulating sides of an organic electronic element. As the encapsulating composition has a liquid form at room temperature, the present application can encapsulate an organic electronic element by a method of applying the composition to the side of the element.

In an embodiment of the present application, a process of applying a liquid composition is performed in sealing sides of an organic electronic element, whereas conventionally, there has been a problem that since the composition has high fluidity after application, it is difficult to maintain the desired encapsulation shape. In one example, the present application performs pre-curing by irradiating the encapsulating composition applied at a desired position with light, so that the final curing can proceed after the fluidity is controlled. Accordingly, the present application can keep the applied encapsulating composition in the desired encapsulated shape until final curing. That is, as the encapsulating composition comprises the above-described specific composition, the present application can introduce a double-curing method, whereby the flow control at high temperature is possible after the encapsulating composition is applied.

The encapsulating composition according to the present application may comprise various additives within the range without affecting the above-mentioned effects of invention, in addition to the above-mentioned configurations. For example, the resin composition may comprise a defoamer, a coupling agent, a tackifier, a ultraviolet stabilizer or an antioxidant, and the like in an appropriate range of content depending on the desired physical properties. In one example, the encapsulating composition may further comprise a defoamer. By comprising the defoamer, the present application can realize defoaming characteristics in the above-described process of applying the encapsulating composition to provide a reliable encapsulating structure. Also, the kind of the defoamer is not particularly limited as long as the physical properties of the encapsulating composition required in the present application are satisfied.

In one example, the encapsulating composition may be a pressure-sensitive adhesive composition or an adhesive composition. Accordingly, the encapsulating composition can also serve as a structural adhesive for attaching the substrate on which the organic electronic element is formed and a cover substrate on the element.

The present application also relates to an organic electronic device. An exemplary organic electronic device may comprise, as shown in FIG. 1, a substrate (21); an organic electronic element (23) formed on the substrate (21); and a side encapsulation layer (10) formed on the periphery of the substrate (21) so as to surround the side surfaces of the organic electronic element (23) and including the above-described encapsulating composition. Furthermore, the exemplary organic electronic device may further comprise a top encapsulation layer (11) covering the entire surface of the organic electronic element (23).

The top encapsulation layer and the side encapsulation layer may be present on the same plane. Here, the "same" may mean substantially the same. For example, in the same plane, the substantially the same means that it may have an error within ±5 μm or ±1 μm in the thickness direction. The top encapsulation layer can encapsulate the upper surface of the element, and can seal the side surfaces together as well as the upper surface. The side encapsulation layer may be formed on the side surface of the element, but may not directly contact the side surface of the organic electronic element. For example, the top encapsulation layer can be sealed so as to directly contact with the upper surface and side surfaces of the element. That is, the side encapsulation layer may be located, in the plan view of the organic electronic device, at the periphery of the substrate without contacting the element.

In this specification, the term "periphery" means the edge portion of the perimeter. That is, the periphery of the substrate herein may mean the edge portion of the perimeter in the substrate.

The material constituting the side encapsulation layer is not particularly limited, but may comprise the encapsulating composition as described above.

On the other hand, the top encapsulation layer may comprise an encapsulating resin, where the encapsulating resin may be exemplified by an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof, and the like. The components constituting the top encapsulation layer may be the same as or different from those of the encapsulating composition as described above. However, the top encapsulation layer may not include the above-mentioned moisture adsorbent or may include a small amount in that the top encapsulation layer is in direct contact with the element. For example, the top encapsulation layer may include 0 to 20 parts by weight of the moisture adsorbent relative to 100 parts by weight of the encapsulating resin.

In one example, the organic electronic element may comprise a reflective electrode layer formed on a substrate, an organic layer formed on the reflective electrode layer and including at least a light emitting layer, and a transparent electrode layer formed on the organic layer.

In the present application, the organic electronic element (23) may be an organic light emitting diode.

In one example, the organic electronic device according to the present application may be in a top emission type, but is not limited thereto, and may be applied to a bottom emission type.

The organic electronic element may further comprise a protective membrane (passivation membrane) for protecting an electrode between the top encapsulation layer or the side encapsulation layer and the electrode of the element. The protective membrane may be in the form of alternately laminating an organic membrane and an inorganic membrane. In one example, the inorganic membrane may be one or more metal oxides or nitrides selected from the group consisting of Al, Zr, Ti, Hf, Ta, In, Sn, Zn and Si. The inorganic membrane may have a thickness of 0.01 μm to 50 μm or 0.1 μm to 20 μm or 1 μm to 10 μm. In one example, the inorganic membrane of the present application may be an inorganic material that does not include a dopant, or may be an inorganic material containing a dopant. The dopant which can be doped is one or more elements selected from the group consisting of Ga, Si, Ge, Al, Sn, B, In, Tl, Sc, V, Cr, Mn, Fe, Co and Ni, or an oxide of the element, but is not limited thereto.

The present application also relates to a method for manufacturing an organic electronic device.

In one example, the manufacturing method may comprises a step of applying the above-described encapsulating composition on the periphery of a substrate (21) on which an organic electronic element (23) is formed so as to surround the side surfaces of the organic electronic element (23). The step of applying the encapsulating composition may be a step of forming the side encapsulation layer (10) as described above.

Specifically, the step of forming the side encapsulation layer may comprise a step of applying the above-described encapsulating composition so as to surround the side surfaces of the organic electronic element (23), and may further comprise a step of curing the encapsulating composition. The step of curing the encapsulating composition may comprise a step of irradiating it with light and/or a step of applying heat. In one example, the encapsulating composition can be cured through only one step of light irradiation, but is not so limited thereto, and may comprise a pre-curing step and a final curing step. The pre-curing step may comprise irradiating it with light, and the final curing step may comprise irradiating it with light or applying heat.

Here, the substrate (21) on which an organic electronic element (23) is formed may be produced by forming a reflective electrode or a transparent electrode on a substrate (21) such as glass or a film by a method such as vacuum deposition or sputtering, and forming an organic material layer on the reflective electrode. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode. Then, the above-described side encapsulation layer (10) is applied on the periphery of the substrate (21) so as to cover the side of the organic electronic element (23). At this time, the method of forming a side encapsulation layer (10) is not particularly limited, and the above-described encapsulating composition may be applied on the side of the substrate (21) using a process such as screen printing or dispenser applying. Furthermore, a top encapsulation layer (11) for encapsulating the entire surface of the organic electronic element (23) can be applied. As the method of forming a top encapsulation layer (11), a known method in the art can be applied, and for example, a liquid drop injection (one drop fill) process can be used.

In addition, in the present invention, a curing process may also be performed on the top or side encapsulation layer for sealing the organic electronic element, where this curing process (final curing) may proceed, for example, in a heating chamber or a UV chamber, and preferably in both. The conditions upon the final curing can be appropriately selected in consideration of the stability of the organic electronic device, and the like.

In one example, after the above-described encapsulating composition is applied, the composition may be irradiated with light to induce crosslinking. The light irradiation may comprise irradiating it with light having a wavelength range of the UV-A region band at a light quantity of 0.3 to 6 J/cm$^2$ or a light quantity of 0.5 to 4 J/cm$^2$. As described above, it is possible to realize an encapsulating structure shape that can become a basis by pre-curing it through irradiation of light.

In one example, the manufacturing method may comprise finally curing the encapsulating composition pre-cured after light irradiation. The final curing may further comprise heat-curing it at a temperature of 40° C. to 200° C., 50° C. to 150° C. or 70° C. to 120° C. for 1 hour to 24 hours, 1 hour to 20 hours, 1 hour to 10 hours or 1 hour to 5 hours. Also, the final curing may comprise irradiating it with light having a wavelength range of the UV-A region band at a light quantity of 0.3 to 6 J/cm$^2$ or a light quantity of 0.5 to 4 J/cm$^2$. The final curing of the encapsulating composition may proceed through the step of applying heat or the step of irradiating it with light.

Advantageous Effects

The present application provides an encapsulating composition which can form an encapsulating structure capable of effectively blocking water or oxygen introduced from the outside into the organic electronic device, thereby securing the lifetime of the organic electronic device and realizing endurance reliability of the encapsulating structure at high temperature and high humidity, and has high shape retention characteristics, and an organic electronic device comprising the same.

BRIEF DESCRIPTION OF DRAWINGS

FIG. 1 is a cross-sectional view showing an organic electronic device according to one example of the present invention.

EXPLANATION OF REFERENCE NUMERALS

1: encapsulating composition
10: side encapsulation layer
11: top encapsulation layer
21: substrate
22: cover substrate
23: organic electronic element

BEST MODE

Hereinafter, the present invention will be described in more detail by way of examples according to the present invention and comparative examples not according to the present invention, but the scope of the present invention is not limited by the following examples.

Hereinafter, in Examples and Comparative Examples, as the olefin-based resin, an acid anhydride-modified polyisobutylene resin (BASF, Glissopal SA, hereinafter, PIBSA) was used. As the bifunctional (multifunctional) curable oligomer, epoxy acrylate (Sartomer, CN110, Tg 60° C.), urethane acrylate (Sartomer, CN9021, Tg −54° C.) and a flexible epoxy (Epiclon-EXA-4816, hereinafter, EXA4816, Tg −20° C.) were used and as the curable monomer, an alicyclic epoxy resin (Daicel, Celloxide 2021P, Mw: 250 g/mol, epoxy equivalent: 130 g/eq, viscosity 250 cPs, hereinafter, C2021P), monofunctional acrylate (SR420) and 1,6-hexanediol diacrylate (HDDA) were used. As the inorganic filler, fumed silica (Aerosil, Evonik, R805, particle size 10 to 20 nm, BET=150 m$^2$/g) was used and as the moisture adsorbent, calcium oxide (CaO, average particle diameter 8 μm, Aldrich) was used. As the photoinitiator, a photo-cationic initiator (San-apro, CPI-101A) and a radical initiator (TPO) were used.

Examples 1 to 4 and Comparative Examples 1 to 4

For the above composition, components were compounded in the weight ratios as shown in Table 1 below and introduced into a mixing vessel. The unit is parts by weight. In the mixing vessel, uniform composition solutions were prepared using a planetary mixer (Kurabo, KK-250s).

TABLE 1

|  | Example | | | | Comparative Example | | | |
| --- | --- | --- | --- | --- | --- | --- | --- | --- |
|  | 1 | 2 | 3 | 4 | 1 | 2 | 3 | 4 |
| PIBSA | 65 | 65 | 65 | 65 | 60 | 67 | 40 | 40 |
| EXA4816 | 5 |  |  | 5 |  | 8 | 5 |  |
| CN9021 | 15 | 25 | 20 | 15 | 15 | 5 | 35 | 40 |
| CN110 | — |  |  |  | 15 |  |  |  |
| HDDA | 5 |  |  | 5 | 10 | 5 | 10 | 10 |
| C2021P | 10 | 5 | 5 | 10 |  | 15 | 10 | 10 |
| SR420 | — | 5 | 10 |  |  |  |  |  |
| R805 | 10 | 10 | 10 | 10 | 10 | 10 | 10 | 10 |
| CaO | 50 | 50 | 50 | 20 | 50 | 50 | 50 | 50 |
| CPI-101A | 2 | 2 | 2 | 2 |  | 2 | 2 | 2 |
| TPO | 5 | 5 | 5 | 5 | 5 | 5 | 5 | 5 |

Hereinafter, the properties of the encapsulating compositions prepared in Examples and Comparative Examples were evaluated in the following manner.

1. Elastic Modulus Measurement

The encapsulating compositions prepared in Examples or Comparative Examples are each formed into a rectangular shape (thickness 10 to 400 μm) of 10×30 mm, a specimen cured at 100° C. for 1 hour after UV irradiation (metal halide lamp 3 J/cm$^2$) is made, and the upper and lower parts of the specimen are attached with a 3M tape so that the center portion becomes 10×10 mm.

The upper and lower tape parts of the manufactured specimen are fixed to a tensile machine, and the length and width of the fixed specimen are loaded so as to be 10×10 mm, and the force applied upon tension in the y-axis direction at a rate of 5 mm/min at 25° C. is measured.

The elastic modulus is measured by substituting the slope in the initial tensile range within 5 mm of the measured graph (X-axis: specimen long axis length, and Y-axis: force applied at the time of tensioning) into the following equation (slope, specimen long axis/short axis length and specimen thickness substitution).

The measurement was performed using a TA (Texture Analyzer)-XT2 plus instrument, and the measurement time was stopped when the specimen was broken.

The elastic modulus was calculated by substituting the slope of the measured graph into the following equation.

$$E = \text{Slope} \times (\text{length}/(\text{width} \times \text{thickness}))$$ [Equation 1]

2. Elongation Measurement

In the graph in which the elastic modulus measurement is completed, the ratio of the elongated length to the initial length of the specimen at the time of fracture is calculated.

$$\text{Elongation (\%)} = \Delta L/L_0 \times 100$$

ΔL means the elongated length of the long axis of the specimen until fracture of the specimen, and $L_0$ means the initial long axis direction length of the specimen.

3. Heat Resistance and Moisture Resistance

The encapsulating composition solutions prepared in Examples or Comparative Examples were each applied on a 0.7 T soda-lime glass to a layer of 200 μm using a coating bar. Then, a sample was prepared by laminating it with the same glass, the encapsulating composition was irradiated with light (metal halide lamp) having a wavelength range of the UV-A region band at a light quantity of 3 J/cm$^2$ and then, heat was applied thereto in an oven at 100° C. for 1 hour. Then, the sample was held in a constant temperature and humidity chamber at 85° C. and 85% relative humidity for about 1000 hours.

The measurement of heat resistance was indicated as O in the case where there was no change in the inside and the side of the coating region and X in the case where voids occurred inside the coating region.

The measurement of moisture resistance was indicated as O in the case where there was no lifting of the region penetrated with moisture and X in the case where the moisture penetration site was lifted from the glass.

4. Moisture Barrier Property

Calcium was deposited to a size of 5 mm×5 mm and a thickness of 100 nm on a glass substrate having a size of 100 mm×100 mm and the encapsulating compositions of Examples and Comparative Examples were each applied to the edge part excluding the calcium. After it was laminated with a cover glass having a size of 100 mm×100 mm in the coated state, UV irradiation was performed at a light quantity of 3 J/cm$^2$ using a metal halide light source, and then heat was applied thereto in an oven at 100° C. for 1 hour. The obtained specimens are observed in a constant temperature and humidity chamber at 85° C. and 85% relative humidity to observe the time when calcium begins to become transparent by oxidation reaction due to moisture penetration.

TABLE 2

|  |  | Elastic Modulus (Pa = N/m$^2$) | Elongation (%) | Heat Resistance/ Moisture Resistance | Moisture Barrier Property (hour) |
| --- | --- | --- | --- | --- | --- |
| Example | 1 | 0.40 | 78 | O/O | 1500 |
|  | 2 | 0.78 | 92 | O/O | 1200 |
|  | 3 | 0.11 | 160 | O/O | 1100 |
|  | 4 | 0.50 | 74 | O/O | 320 |

TABLE 2-continued

|  | | Elastic Modulus (Pa = N/m²) | Elongation (%) | Heat Resistance/ Moisture Resistance | Moisture Barrier Property (hour) |
|---|---|---|---|---|---|
| Comparative Example | 1 | 53.4 | 61 | ○/X | 850 |
|  | 2 | 34.2 | 59 | X/○ | 920 |
|  | 3 | 2.42 | 86 | ○/X | 690 |
|  | 4 | 2.82 | 108 | ○/X | 520 |

The invention claimed is:

1. A composition for encapsulating an organic electronic element, the composition comprising:
an olefin-based resin,
a curable monomer, and
a curable oligomer which is comprised in an amount of 20 to 90 parts by weight relative to 100 parts by weight of the olefin-based resin and has a glass transition temperature of 0° C. or less after curing,
wherein the olefin-based resin has at least one reactive functional group.

2. The composition according to claim 1, wherein the olefin-based resin has a weight average molecular weight of 100,000 or less.

3. The composition according to claim 1, wherein the reactive functional group comprises an acid anhydride group, a carboxyl group, an epoxy group, an amino group, a hydroxyl group, an isocyanate group, an oxazoline group, an oxetane group, a cyanate group, a phenol group, a hydrazide group or an amide group.

4. The composition according to claim 1, wherein the curable oligomer has a weight average molecular weight in a range of 400 to 50,000 g/mol.

5. The composition according to claim 1, wherein the curable oligomer comprises one or more curable functional groups.

6. The composition according to claim 5, wherein the curable functional group comprises an epoxy group, a glycidyl group, an isocyanate group, a hydroxyl group, a carboxyl group, an amide group, a urethane group, an epoxide group, a cyclic ether group, a sulfide group, an acetal group or a lactone group.

7. The composition according to claim 1, wherein the curable monomer has a weight average molecular weight of less than 400 g/mol.

8. The composition according to claim 1, wherein the curable monomer comprises an epoxy compound, an oxetane compound or an acrylate monomer.

9. The composition according to claim 1, wherein the curable monomer is comprised in an amount of 10 to 45 parts by weight relative to 100 parts by weight of the olefin-based resin.

10. The composition according to claim 1, further comprising an inorganic filler.

11. The composition according to claim 10, wherein the inorganic filler is comprised in an amount of 0.1 parts by weight to 30 parts by weight relative to 100 parts by weight of the olefin-based resin.

12. The composition according to claim 1, further comprising a cationic initiator or a radical initiator.

13. The composition according to claim 1, further comprising a cationic initiator and a radical initiator, where the cationic initiator is comprised in an amount of 0.01 to 5 parts by weight relative to 100 parts by weight of the olefin-based resin and the radical initiator is comprised in an amount of 3 to 12 parts by weight relative to 100 parts by weight of the olefin-based resin.

14. The composition according to claim 1, further comprising a moisture adsorbent.

15. The composition according to claim 14, wherein the moisture adsorbent comprises a moisture-reactive adsorbent.

16. The composition according to claim 14, wherein the moisture adsorbent has an average particle diameter in a range of 0.1 to 10 μm.

17. The composition according to claim 14, wherein the moisture adsorbent is comprised in an amount of 10 to 150 parts by weight relative to 100 parts by weight of the olefin-based resin.

18. An organic electronic device comprising a substrate; an organic electronic element formed on the substrate; and a side encapsulation layer formed on the periphery of the substrate so as to surround side surfaces of the organic electronic element and comprising the composition for encapsulating an organic electronic element according to claim 1.

19. A method for manufacturing an organic electronic device comprising steps of applying the composition for encapsulating an organic electronic element of claim 1 on the periphery of a substrate on which an organic electronic element is formed, so as to surround side surfaces of the organic electronic element, and curing the composition for encapsulating an organic electronic element.

* * * * *